United States Patent
Poechmueller

(10) Patent No.: US 6,504,751 B2
(45) Date of Patent: Jan. 7, 2003

(54) INTEGRATED MEMORY HAVING MEMORY CELLS WITH A MAGNETORESISTIVE STORAGE PROPERTY AND METHOD OF OPERATING SUCH A MEMORY

(75) Inventor: Peter Poechmueller, Colchester, VT (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/898,224

(22) Filed: Jul. 3, 2001

(65) Prior Publication Data

US 2002/0001224 A1 Jan. 3, 2002

(30) Foreign Application Priority Data

Jul. 3, 2000 (DE) .......................................... 100 32 275

(51) Int. Cl.[7] ................................................ G11C 11/00
(52) U.S. Cl. ................... 365/158; 365/157; 365/230.06
(58) Field of Search ................................. 365/158, 157, 365/230.06

(56) References Cited

U.S. PATENT DOCUMENTS 4,829,476 A  5/1989  Dupuis et al.
6,191,972 B1 *  2/2001  Miura et al. ................. 365/158
6,341,084 B2  1/2002  Numata et al.
6,342,713 B1 *  1/2002  Johnson ....................... 257/295

FOREIGN PATENT DOCUMENTS

EP      0 918 334 A2   5/1999
WO      WO 99/14760    3/1999

OTHER PUBLICATIONS

Tietze/Schenk: "Halbleiter–Schaltungstechnik" [semiconductor circuit technology], Springer Verlag, Berlin, 1986, 206–207.

* cited by examiner

Primary Examiner—Huan Hoang
(74) Attorney, Agent, or Firm—Laurence A. Greenberg; Werner H. Stemer; Ralph E. Locher

(57) ABSTRACT

An integrated memory has memory cells with a magnetoresistive storage property. The memory cells are connected in each case between column lines and row lines. For reading a data signal of a memory cell connected to a row line, one of the row lines is connected in a selection circuit to a terminal for a selection signal. The other row lines are driven in such a way that they are electrically isolated in the selection circuit for the reading of the data signal. As a result, a comparatively reliable reading operation is possible.

11 Claims, 1 Drawing Sheet

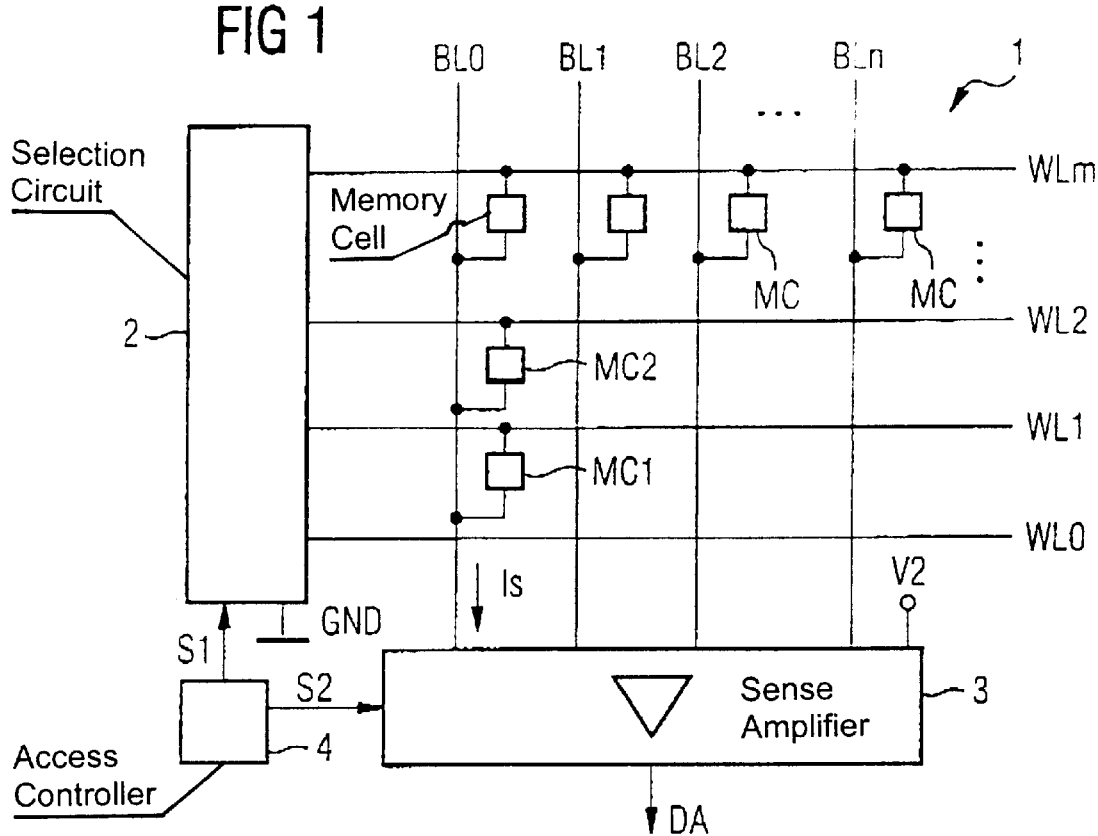
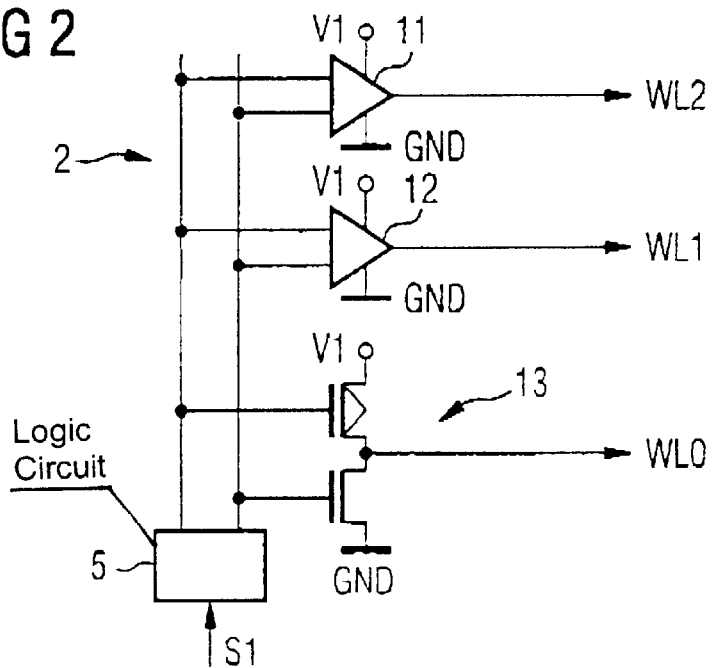

INTEGRATED MEMORY HAVING MEMORY CELLS WITH A MAGNETORESISTIVE STORAGE PROPERTY AND METHOD OF OPERATING SUCH A MEMORY

BACKGROUND OF THE INVENTION

FIELD OF THE INVENTION

The present invention relates to an integrated memory having memory cells with a magnetoresistive storage property. The memory cells are in each case connected between one of a plurality of column lines and one of a plurality of row lines. The invention also relates to a method of operating such a memory.

Memory cells with a magnetoresistive storage effect generally have variable-state ferromagnetic layers for storing data signals. This storage effect is generally referred to as the GMR (giant magnetoresistive) effect or TMR (tunneling magnetoresistive) effect. In this case, the electrical resistance of such a memory cell is dependent on the magnetization of the ferromagnetic layers.

Integrated memories having memory cells of this type, also referred to as MRAMs (Magnetoresistive Random Access Memory), are often of a similar structure to that of, for example, integrated memories of the DRAM (Dynamic Random Access Memory) type. Memories of this type generally have a memory cell configuration with row lines and column lines which run essentially parallel to one another, with the row lines usually running transversely with respect to the column lines.

A MRAM memory of this type is known from International Publication No. WO 99/14760. There, the memory cells are connected in each case between one of the row lines and one of the column lines and are electrically connected to the respective column line and row line. The memory cells with a magnetoresistive storage effect have in this case a higher impedance than the row lines and column lines. The row lines are in each case connected to a terminal for a selection signal for reading a data signal of one of the memory cells via the column line connected to the memory cell. For the reading of a data signal of one of the memory cells, the column lines are connected to a sense amplifier. For reading, the current which can be detected on the column line is measured.

In the case of a MRAM memory of this type, there are no diodes or transistors to connect the memory cells to the respective column line for reading or writing a data signal in response to being addressed. This achieves advantages, in particular in terms of the geometrical configuration of the memory cells.

For a properly conducted reading operation, it is important that all the column lines and row lines apart from the selected row line are at the same potential. If, for example, the potentials differ between the column line to be read from and a column line that has not been selected, the current to be detected is superposed by parasitic currents which arise due to a difference in potential on the column line to be read from. This may lead to a defective reading operation in respect of the memory cell to be read from.

The row lines are generally connected to row line drivers, so that the row lines are at a predetermined potential. The column lines have a corresponding potential applied to them via corresponding sense amplifiers. In particular in the case of spatially distributed configurations of row line drivers and sense amplifiers along the memory cell array of the integrated memory, it is comparatively difficult to configure and operate the row line drivers and sense amplifiers in such a way that the corresponding column lines and row lines are in each case at exactly the same potential.

SUMMARY OF THE INVENTION

It is accordingly an object of the invention to provide an integrated memory with a magnetoresistive storage effect which overcomes the above-mentioned disadvantages of the heretofore-known integrated memories of this general type and which allows a comparatively reliable reading of one of the memory cells.

It is also an object of the present invention to provide a method of operating such an integrated memory that allows a comparatively reliable reading operation for one of the memory cells.

With the foregoing and other objects in view there is provided, in accordance with the invention, an integrated memory, including:

a plurality of column lines;

a plurality of row lines;

a plurality of memory cells each connected between a respective one of the column lines and a respective one of the row lines, the memory cells having a magnetoresistive storage property;

a terminal for providing a selection signal;

a selection circuit connected to the row lines such that in each case one of the row lines is connectable, in the selection circuit, to the terminal in order to read a data signal from one of the memory cells connected to the one of the row lines; and a control device operatively connected to the selection circuit and controlling the selection circuit such that given ones of the row lines not connected to the one of the memory cells are electrically isolated in the selection circuit for reading the data signal.

In other words, the object of the invention concerning the integrated memory is achieved by an integrated memory of the type described above in which the row lines are connected to a selection circuit, in which one of the row lines in each case can be connected in the selection circuit to a terminal for a selection signal for reading a data signal of a memory cell connected to the row line and in which the selection circuit is configured and can be driven by control device in such a way that the row lines not connected to the memory cell are electrically isolated in the selection circuit for the reading of the data signal.

With the objects of the invention in view there is also provided, a method of operating an integrated memory, the method includes the steps of:

providing memory cells having a magnetoresistive storage property, the memory cells being connected in each case between one of a plurality of column lines and one of a plurality of row lines;

connecting, during a reading operation, one of the row lines in a selection circuit to a terminal for a selection signal and reading a data signal of one of the memory cells connected to the one of the row lines; and electrically isolating those row lines, which are not connected to the one of the memory cells, in the selection circuit during the reading operation.

In other words, the object of the invention concerning the method is achieved by a method of operating an integrated memory of the type described above in which, during a reading operation, one of the row lines is connected in a selection circuit to a terminal for a selection signal and a reading of a data signal of a memory cell connected to the row line takes place, and in which the row lines not connected to the memory cell are electrically isolated in the selection circuit during the reading operation.

The integrated memory according to the invention and the method of operating an integrated memory according to the invention make it possible to avoid parasitic currents during the reading of a data signal of one of the memory cells. This is achieved by the row lines that have not been selected being driven in such a way that they are electrically isolated in the selection circuit during the reading. These row lines accordingly have a kind of floating state and can be brought to a uniform potential. The avoidance of parasitic currents allows a comparatively reliable reading of the data signal, since the current to be detected, on the basis of which conclusions are drawn with respect to the information stored in the memory cell, is not superposed or falsified by parasitic currents.

In one embodiment of the memory according to the invention, the row lines are in each case connected to a driver circuit which can be operated in a conducting state or in a nonconducting state. These driver circuits can be used to drive nonselected row lines in such a way that they are electrically isolated for the reading of the data signal. For this purpose, the driver circuits are operated in the nonconducting state. The respective driver circuit has, for example, switching devices in the form of transistors which are connected to the respective row line via their source-drain paths. These transistors are operated in a corresponding nonconducting state.

In one embodiment of the method according to the invention, the row lines are precharged to a common precharging potential. The precharging is followed by reading of the data signal. This may take place by using a suitable precharging device of the memory. In this way it can be ensured that the floating row lines are at a common potential directly before the respective reading of a data signal. In this case, the reading of the data signal is preferably delayed until the respective potential profiles on the row lines are in a static state.

In a further embodiment of the invention, the row lines are precharged via at least one of the column lines. In this case, it is advantageous to precharge the row lines via all the column lines. The row lines are in this case charged via the respective memory cells to the potential of the respective column lines. Since the memory cells have a resistance characteristic, it is ensured that the row lines assume exactly the potential of the column lines when a static state is achieved. This achieves the overall effect that all the nonselected row lines and the column lines are at the same potential directly before reading.

In an other embodiment of the invention, the column lines are precharged by a sense amplifier, which also serves for the reading of a data signal of a selected memory cell. The sense amplifier is connected to the corresponding column line for the reading of the data signal. The precharging of the column lines or the row lines by one or more sense amplifiers is carried out before the respective reading. For this purpose, the respective sense amplifier is configured as a suitable precharging device. The time period until potential equalization between the column lines and row lines is achieved is not significant, since rapid potential equalization can be achieved between the column lines and one of the row lines by the parallel connection of the memory cells.

Other features which are considered as characteristic for the invention are set forth in the appended claims.

Although the invention is illustrated and described herein as embodied in an integrated memory having memory cells with a magnetoresistive storage effect and a method of operating such a memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic circuit diagram of an exemplary embodiment of the integrated memory according to the invention having magnetoresistive memory cells; and FIG. 2 is a schematic circuit diagram of an embodiment of a row selection circuit according to FIG. 1.

DESCRIPTION OF THE PREFERRED EMBODIMENTS

Referring now to the figures of the drawings in detail and first, particularly, to FIG. 1 thereof, there is shown an exemplary embodiment of a memory according to the invention having memory cells MC with a magnetoresistive storage effect. All known GMR/TMR elements are suitable as memory cells, as long as they have a higher impedance than the column lines and row lines. Here, the column lines are designated as bit lines BL0 to BLn, the row lines as word lines WL0 to WLm. The number of word lines and bit lines which the memory has here is given by way of example. The memory cells MC, which are provided in a memory cell array 1 in the form of a matrix, are in each case connected between one of the bit lines BL0 to BLn and one of the word lines WL0 to WLm. The word lines WL0 to WLm are also connected to a row selection circuit 2. The bit lines BL0 to BLn are connected to a sense amplifier or read amplifier 3, by which a data signal DA of one of the memory cells MC can be read. For reading a data signal DA, that bit line to which the memory cell to be read from is connected is connected to the sense amplifier 3. The selection circuit 2 and the sense amplifier 3 can be driven in a suitable way by using the access controller 4 as a control device through the use of the signals S1 and S2.

For reading an item of information stored in a memory cell, the word line concerned is driven. This word line has a selection signal or a predetermined selection potential applied to it, so that a current flow occurs through the memory cell to be read from. In this case, it is important that all the other word lines and the bit lines are at an identical potential, for example a potential V2 of the integrated memory. For reading the data signal DA, the bit line connected to the memory cell to be read from is connected to the sense amplifier 3, which detects this current flow.

It shall be assumed hereafter that a data signal DA of the memory cell MC2 is to be read. Before the reading, it must be ensured that all the bit lines BL0 to BLn and word lines WL0 to WLm are at the same potential, so that no current flow occurs through the memory cells. The word lines are in this case connected correspondingly by the selection circuit 2 to a potential which is the same as that to which the bit lines are connected by the sense amplifier 3. For the reading of the data signal DA of the memory cell MC2, the word line WL2 is subsequently connected to a corresponding selection potential. As a result, a current IS flows through the memory cell MC2, between the word line WL2 and the bit line BL0. In this case, the resistance of the memory cell MC2 is dependent on the information stored in the memory cell MC2. The resultant current IS is detected by the sense amplifier 3 and the corresponding data signal DA of the memory cell MC2 is generated from it. If, in the case of a reading operation of this type, for example the word line WL1 is at a different potential than the bit line BL0, a parasitic current is generated by the memory cell MC1 on the bit line BL0 and is superposed on or falsifies the reading current IS. In this case, it is possible that the data signal DA is not read properly, for example due to a resulting falsified threshold decision.

In one embodiment according to the invention it is consequently provided that, for this case, the word lines WL0, WL1 and WLm are electrically isolated in the selection circuit 2 during the reading of the data signal DA from the memory cell MC2. The word line WL2 is connected for example to a selection potential GND for the reading of the data signal DA.

The word lines WL0, WL1 and WLm have a kind of floating state. To ensure that all the bits lines BL0 to BLn and the word lines WL0, WL1 and WLm are at the same potential during the reading operation, they are precharged to the common precharging potential V2. This is carried out for example by the sense amplifier 3, which is connected for this purpose to the corresponding bit lines.

Since the word lines are connected to the bit lines via the memory cells MC, a potential equalization is obtained as a result. In this case, the subsequent reading is delayed until the respective potential profiles on the word lines and bit lines have a static state. Since the memory cells MC have a resistance characteristic, it is ensured that a complete potential equalization occurs between the bit lines and word lines. This ensures that, before and during the reading of the data signal DA, no parasitic currents occur on the column line concerned. Directly after the precharging by the sense amplifier 3, reading of the memory cell MC2 is initiated. For this purpose, the precharged word lines WL0, WL1 and WLm remain electrically isolated in the selection circuit 2.

FIG. 2 shows an embodiment of the line selection circuit 2 according to FIG. 1. The word lines WL0, WL1 and WL2 shown here are in each case connected to driver circuits 11, 12 and 13, respectively. The driver circuits 11 to 13 are in this case of the same structure, as shown by the example of the driver circuit 13. The driver circuits have in each case a PMOS transistor and a NMOS transistor, which can be driven by a logic circuit 5. The logic circuit 5 is driven by the signal S1 of the access controller 4. When no reading operation is taking place, the word lines are connected to the potential V1 via the corresponding transistors. For selection of the word line WL2 for example, the latter is connected to the reference potential GND via the corresponding transistor. To isolate the word lines WL1 and WL0 during the reading operation, the driver circuits 12 and 13 are in a nonconducting state during the reading operation. The word lines WL0 and WL1 can therefore be precharged to the precharging potential V2 by the sense amplifier 3 from FIG. 1. For the nonconducting state of the respective driver circuit, its transistors are made to assume a blocking state.

I claim:

1. An integrated memory, comprising:
    a plurality of column lines;
    a plurality of row lines;
    a plurality of memory cells each connected between a respective one of said column lines and a respective one of said row lines, said memory cells having a magnetoresistive storage property;
    a terminal for providing a selection signal;
    a selection circuit connected to said row lines such that in each case one of said row lines is connectable, in said selection circuit, to said terminal in order to read a data signal from one of said memory cells connected to said one of said row lines; and
    a control device operatively connected to said selection circuit and controlling said selection circuit such that given ones of said row lines not connected to said one of said memory cells for reading the data signal are electrically isolated in said selection circuit.

2. The integrated memory according to claim 1, including a plurality of driver circuits each connected to a respective one of said column lines, said driver circuits selectively being operated in a conducting state and a nonconducting state.

3. The integrated memory according to claim 1, including a precharging device for precharging said row lines to a common precharging potential.

4. The integrated memory according to claim 3, wherein said precharging device is connected to at least one of said column lines for precharging said row lines.

5. The integrated memory according to claim 1, including:
    a sense amplifier connected to one of said column lines for reading out said one of said memory cells, said one of said column lines being connected to said one of said memory cells to be read out; and
    said sense amplifier operating as a precharging device for precharging said row lines to a common precharging potential.

6. A method of operating an integrated memory, the method which comprises:
    providing memory cells having a magnetoresistive storage property, the memory cells being connected in each case between one of a plurality of column lines and one of a plurality of row lines;
    connecting, during a reading operation, one of the row lines in a selection circuit to a terminal for a selection signal and reading a data signal of one of the memory cells connected to the one of the row lines; and
    electrically isolating, during the reading operation, given ones of the row lines not connected to the one of the memory cells in the selection circuit.

7. The method according to claim 6, which comprises:
    precharging the row lines to a common precharging potential; and
    performing the step of reading the data signal after the precharging step.

8. The method according to claim 7, which comprises delaying the step of reading the data signal until respective potential profiles on the row lines are in a static state.

9. The method according to claim 7, which comprises precharging the row lines via at least one of the column lines.

10. The method according to claim 9, which comprises precharging the at least one of the column lines with a sense amplifier.

11. The method according to claim 6, which comprises detecting a current on one of the column lines connected to the one of the memory cells for reading the data signal.

* * * * *